United States Patent
Zabbal et al.

(10) Patent No.: US 12,523,676 B2
(45) Date of Patent: Jan. 13, 2026

(54) METHOD OF MONITORING AT LEAST ONE OF AN OVERLAY OR AN ALIGNMENT BETWEEN LAYERS OF A SEMICONDUCTOR SUBSTRATE, SCANNING PROBE MICROSCOPY SYSTEM AND COMPUTER PROGRAM

(71) Applicant: Nearfield Instruments B.V., Rotterdam (NL)

(72) Inventors: Paul Zabbal, Amsterdam (NL); Chung Bin Chuang, Best (NL); Daniele Piras, Rotterdam (NL)

(73) Assignee: Nearfield Instruments B.V., Rotterdam (NL)

( * ) Notice: Subject to any disclaimer, the term of this patent is extended or adjusted under 35 U.S.C. 154(b) by 465 days.

(21) Appl. No.: 17/924,416

(22) PCT Filed: May 11, 2021

(86) PCT No.: PCT/NL2021/050304
§ 371 (c)(1),
(2) Date: Nov. 10, 2022

(87) PCT Pub. No.: WO2021/230744
PCT Pub. Date: Nov. 18, 2021

(65) Prior Publication Data
US 2023/0184807 A1     Jun. 15, 2023

(30) Foreign Application Priority Data
May 11, 2021    (NL) .................................... 2025569

(51) Int. Cl.
*G01Q 30/04* (2010.01)
*G03F 7/00* (2006.01)
(Continued)

(52) U.S. Cl.
CPC ......... *G01Q 30/04* (2013.01); *G03F 7/70633* (2013.01); *H01L 21/681* (2013.01); *H01L 22/12* (2013.01)

(58) Field of Classification Search
CPC ........ G01Q 30/04; G01Q 60/32; G01Q 60/37; H01L 22/12; H01L 22/681
See application file for complete search history.

(56) References Cited

U.S. PATENT DOCUMENTS

| 6,392,229 B1 | 5/2002 | Dana et al. |
| 2007/0210252 A1 | 9/2007 | Miyamoto et al. |

(Continued)

FOREIGN PATENT DOCUMENTS

| EP | 3171396 A1 * | 5/2017 | ......... G03F 7/70625 |
| EP | 3543712 A1 * | 9/2019 | ............. G01Q 60/32 |
| WO | WO-2020064542 A1 * | 4/2020 | ............. G03F 7/705 |

*Primary Examiner* — David E Smith
(74) *Attorney, Agent, or Firm* — Banner & Witcoff, Ltd.

(57) ABSTRACT

The present document relates to a method of monitoring an overlay or alignment between a first and second layer of a semiconductor using a scanning probe microscopy system. The method comprises scanning the substrate surface using a probe tip for obtaining a measurement of a topography of the first and second layer in at least one scanning direction. At least one pattern template is generated which is matched with the topography of the first layer for determining a first candidate pattern. The first candidate pattern is matched with the measured second topography for obtaining a second candidate pattern to represent the measured topography of the second layer. Feature characteristics of device features are determined from both the first and second candidate pattern, and these are used to calculate one or more overlay parameters or alignment parameters.

17 Claims, 8 Drawing Sheets

(51) Int. Cl.
    *H01L 21/66*     (2006.01)
    *H01L 21/68*     (2006.01)

(56) References Cited

U.S. PATENT DOCUMENTS

2019/0113338 A1*   4/2019   Mack .................. G03F 7/70616
2019/0369138 A1   12/2019   Zhang et al.
2019/0383753 A1*  12/2019   Zhang .............. G01N 21/95607

* cited by examiner

METHOD OF MONITORING AT LEAST ONE OF AN OVERLAY OR AN ALIGNMENT BETWEEN LAYERS OF A SEMICONDUCTOR SUBSTRATE, SCANNING PROBE MICROSCOPY SYSTEM AND COMPUTER PROGRAM

CROSS-REFERENCE TO RELATED APPLICATIONS

This application is a U.S. National Stage application under 35 U.S.C. § 371 of International Application PCT/NL2021/050304 (published as WO 2021/230744 A1), filed May 11, 2021 which claims the benefit of priority to Application NL 2025569, filed May 12, 2020. Benefit of the filing date of these prior applications is hereby claimed. Each of these prior applications is hereby incorporated by reference in its entirety.

FIELD OF THE INVENTION

The present invention is directed at a method of monitoring at least one of an overlay or an alignment between a first and a second layer of a semiconductor substrate using a scanning probe microscopy system, wherein the method comprises: scanning the substrate surface, using a probe tip of the scanning probe microscopy system, in at least one scanning direction, for obtaining a measurement of a first topography of the first layer and of a second topography of the second layer in the at least one scanning direction. The invention further relates to a scanning probe microscopy system configured for imaging structures on or below a surface of a semiconductor substrate, for enabling the imaging of layer topographies of a first and a second layer of the semiconductor substrate, and configured for performing a method as described above. The method further relates to a computer program product for operating a scanning probe microscopy system and a computer readable medium.

BACKGROUND

Monitoring overlay and alignment is an important part of semiconductor manufacturing in order to meet the quality requirements and increase the yield of well working and operational substrates. Overlay metrology is the control of pattern-to-pattern alignment in the semiconductor industry. Misalignment of any kind can cause short circuits and connection failures. Although conventionally this could be done on the basis of optical monitoring methods, such methods increasingly fail to meet the modern standards of the fabrication process. As the structures on semiconductor elements become smaller, overlay and alignment checks become more and more important. Not only do the optical methods fall short in being diffraction limited, also the use of opaque semiconductor layers makes it necessary to consider alternatives to the existing optical methods.

New monitoring methods are being developed which overcome the above disadvantages. Amongst others, overlay and alignment monitoring may be performed using scattering based subsurface scanning probe microscopy, wherein the application of a very high frequency (>1 Gigahertz (GHz)) acoustic signal is used to detect deeply buried structures underneath a substrate surface. One of the challenges in respect of this technology is to obtain a large signal to noise ratio (SNR) to provide a reliable and robust measurement.

SUMMARY OF THE INVENTION

It is an object of the present invention to provide a monitoring method of overlay and alignment between a first and second layer of a semiconductor substrate using scanning probe microscopy, in particular to provide a method that allows inspection of overlay between layers of the substrate, e.g. from surface and shallow layers down to layers buried deeply underneath a substrate surface.

To this end, in accordance with a first aspect of the invention, there is provided herewith a method of monitoring at least one of an overlay or an alignment between a first and a second layer of a semiconductor substrate using a scanning probe microscopy system, wherein the method comprises: scanning the substrate surface, using a probe tip of the scanning probe microscopy system, in at least one scanning direction, for obtaining a measurement of a first topography of the first layer and of a second topography of the second layer in the at least one scanning direction; generate at least one pattern template and matching the measured first topography with the at least one pattern template for determining a first candidate pattern to represent the measured first topography in the at least one scanning direction; correlating the first candidate pattern with the measured second topography for obtaining a second candidate pattern to represent the measured second topography in the at least one scanning direction; determining, from the first candidate pattern, one or more feature characteristics of device features in the first topography; determining, from the second candidate pattern, one or more feature characteristics of device features in the second topography; and calculating, using the determined feature characteristics of the first and second topography, one or more overlay parameters or alignment parameters.

The present invention enhances the scanning probe microscopy (SPM) based overlay detection method by applying a pattern fit to the measured topographies. In particular, the measured topography of one of the layers—as claimed the first layer—is used to generate a pattern template. Typically, but not essentially, the measured topography of the layer providing the best SNR, or in other words the cleanest signal, may be used to generate the pattern template. A pattern template may alternatively be obtained from the other signal, however in order to provide the most reliable overlay and alignment measurements from the end result, starting with the signal providing the strongest SNR will be preferred. Then subsequently, this pattern template may be matched against the first topography to obtain a first candidate pattern that best matches the first topography, and thereafter the first candidate pattern is correlated with the second topography to obtain a second candidate pattern. From these candidate patterns, characteristics of the structural device features in each of the layers may be determined in order to allow comparison thereof and to calculate the alignment and overlay parameters for monitoring these. The resulting overlay and alignment parameters may be monitored more accurately in comparison with a direct measurement thereof from the determined topographies, and as a result the method therefore improves the quality of the manufacturing process as it allows to correct for such misalignment and overlay errors earlier and more accurately as well.

The term 'topography', as used in the present document, can refer to either a surface topography of a sample or substrate surface or a subsurface topography of a layer underneath the surface. The term refers to the geometry of features of a specific layer, i.e. the feature geometry of on-surface features or the feature geometry of subsurface features of a particular layer underneath the surface. Where a particular of either the surface or subsurface topographies is referred to, the term 'topography' may be preceded by an indication thereof, e.g. 'surface' or 'subsurface'. This wording is intended to support intelligibility of the description and thereby comprehension of the invention described, and the presence or absence thereof is not intended to limit the claimed invention which is defined in the claims. The terms 'topography' and 'feature geometry' are applied as synonyms to refer to the same concept, and may be replaced by each other where this is considered more illustrative in the situation described or at hand.

In accordance with some preferred embodiments, the first layer is the surface layer of the semiconductor substrate, such that the first topography is a surface topography of the semiconductor substrate. The surface topography obtained using a standard scanning probe microscopy method, e.g. an atomic force microscopy (AFM) method, provides a sufficiently good signal-to-noise ratio from which a pattern template may well be generated. Moreover, during manufacturing of a semiconductor element, the last deposited layer during the process which provides the momentary surface layer of the (semi) fabricated semiconductor device, may to a certain extent still be corrected upon detection of a misalignment or overlay error. For example, a respective upper layer may be removed and re-deposited in the worst case, in case loss of the whole semiconductor element to be fabricated is to be prevented.

In some embodiments, the step of generating at least one pattern template includes generating a plurality of pattern templates, and wherein the step of matching the measured first topography comprises correlating the measured first topography with each one of the plurality of pattern templates and selecting, as the first candidate pattern, a best matching pattern template of the plurality of pattern templates which best correlates with the measured first topography. These embodiments directly relate the pattern template to the measured first topography, and are therefore sometimes referred to as the 'direct model'. In some of these embodiments, prior to the step of generating, the method comprises obtaining one or more topography dimensions of the first topography, such as a width or a length of a device feature (for example, but not limited to, a top, average or bottom width or a top, average or bottom length of a device feature), an angle between faces or edges of one or more device features, a pitch of a repetitive pattern, or the height of the features. These features may be obtained by analysis of the measured first topography, e.g. as it is obtained by scanning the substrate. In other or further embodiments, the step of generating at least one pattern template includes, based on the measured first topography, providing an initially guessed pattern template and using the initially guessed pattern template as subject pattern at an input of an iterative process for generating the first candidate pattern.

In some of these embodiments, the iterative process includes: comparing the subject pattern with the measured first topography for determining a current correlation value and a current residual parameter, the current residual parameter being indicative of difference between a feature characteristic of the measured first topography and the subject pattern; determine whether a difference between the current correlation value and a preceding correlation value determined in a preceding iteration is smaller or larger than a predetermined threshold; if the difference is larger than the predetermined threshold, set the current correlation value to become the preceding correlation value and modify the subject pattern based on the residual parameter such as to decrease the value of the residual parameter; and if the difference is larger than the predetermined threshold, set the subject pattern to become the first candidate pattern and end the iterative process.

Furthermore, in some of these embodiments, the iterative process includes a least squares algorithm for minimizing a current residual parameter. For example, in accordance with some of these embodiments, the least squares algorithm may include minimization of a cost function, wherein the cost function is:

$$J = \frac{1}{L}\sum_{i=1}^{L}(P_{topography} - P_{template})^2 \quad \text{(eq. 1)}$$

wherein J represents the cost value; L represents a length in pixels of the measured first topography; $P_{topography}$ is a feature characteristic of the measured first topography; and $P_{template}$ is the feature characteristic of the subject pattern; such that the term $(P_{topography} - P_{template})$ represents the current residual parameter.

In some embodiments, prior to performing the iterative process, the initially guessed pattern template is scaled such that an amplitude of the initially guessed pattern template matches the amplitude of the measured first topography. The amplitude is indicative of a pixel value difference between a pixel located on an elevated part of the substrate surface and a pixel located on a lowered part of the substrate surface. As may be appreciated, the amplitude matching is desired to prevent contribution of this correctable difference to the level of deviation between the patterns, such as to enable comparing the guessed pattern template against the measured first topography.

In some embodiments, the step of calculating one or more overlay parameters or alignment parameters includes calculating an average overlay value between the first and the second layer of the semiconductor substrate as follows:

$$\overline{\text{overlay}} = |\mu_{topo\_1} - \mu_{topo\_2}| - 0.5 \cdot \langle w_{topo\_1} + w_{topo\_2} \rangle \quad \text{(eq. 2)}$$

wherein $\mu_{topo\_1}$ is indicative of a mean position of a device feature in the first topography determined from the first candidate pattern; $\mu_{topo\_2}$ is indicative of the mean position of the device feature in the second topography determined from the second candidate pattern; $w_{topo\_1}$ is indicative of a mean width of the device feature in the first topography determined from the first candidate pattern; and $w_{topo\_2}$ is indicative of the mean width of the device feature in the second topography determined from the second candidate pattern.

In accordance with a second aspect thereof, the present invention provides a scanning probe microscopy system configured for imaging structures on or below a surface of a semiconductor substrate, for enabling the imaging of layer topographies of a first and a second layer of the semiconductor substrate, wherein the system comprises a probe for scanning the semiconductor substrate for performing said imaging, the system further including one or more system controller and analyzer parts comprising a processor configured to perform the method according to the first aspect.

In accordance with a third aspect thereof, the invention provides a computer program product for operating a scanning probe microscopy system, the computer program product comprising instructions which, when the program is executed by a computer, such as a controller or analyzer of the scanning probe microscopy system, cause the computer to carry out the method according to the first aspect.

Furthermore, in accordance with a fourth aspect thereof, the invention provides for a computer-readable medium comprising instructions which, when executed by a computer, such as a controller or analyzer of the scanning probe microscopy system, cause the computer to carry out the method according to the first aspect.

BRIEF DESCRIPTION OF THE DRAWINGS

The invention will further be elucidated by description of some specific embodiments thereof, making reference to the attached drawings. The detailed description provides examples of possible implementations of the invention, but is not to be regarded as describing the only embodiments falling under the scope. The scope of the invention is defined in the claims, and the description is to be regarded as illustrative without being restrictive on the invention. In the drawings:

DETAILED DESCRIPTION

Figure 1:
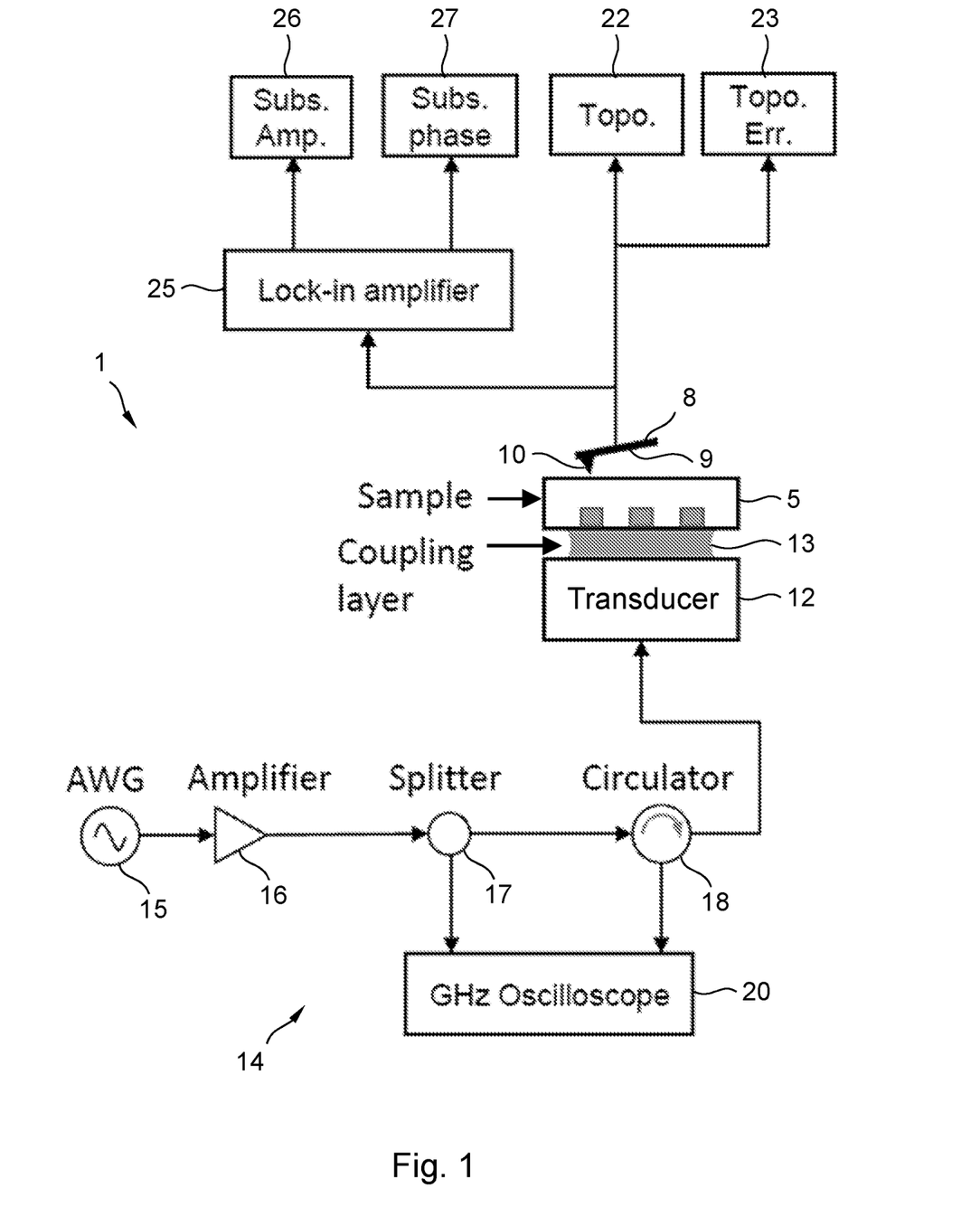
FIG. 1 schematically illustrates a setup of a system in accordance with an embodiment of the present invention, for carrying out a method in accordance with an embodiment.

FIG. 1 schematically illustrates a scanning probe microscopy (SPM) system that is suitable for applying a method in accordance with the present invention. The SPM system of FIG. 1 enables a sample 5, which may be fixed to a sample carrier (not shown), to be investigated using a scanning probe microscopy technique. The system 1 is suitable for carrying out both surface and subsurface topography measurements. The system 1 comprises a probe 8 consisting at least of a cantilever 9 and a probe tip 10, typically mounted on a scan head (not shown) with actuators for bringing the probe tip 10 in contact with the surface of sample 5 and scanning the probe 8 relative to the sample 5. Optionally, the SPM system may be suitable for operating in various operating modes, such as contact, non-contact or tapping mode, as will be appreciated by the skilled person. In order to investigate the sample 5, the probe tip 10 is brought in contact with the surface of the sample 5, for example for measuring a surface topography or a subsurface topography. The sensing of subsurface features in the sample 5 to enable subsurface topography analysis is performed using a transducer 12 in contact with the sample 5, e.g. in the system 1 of FIG. 1 present underneath the sample 5. The transducer 12 may be operated in combination with sensing through the probe 8, as will be explained further below. The transducer 12 provides an acoustic signal that is applied to the sample 5. Thereto, a coupling layer 13 may be present to enable coupling of the acoustic signal into the sample. The coupling layer 13 may be a grease, a gel, or any other substance that enables efficient coupling of the acoustic signal into the sample 5. The transducer 12 underneath the sample 5, which provides the acoustic signal, may be connected to an acoustic generator 14.

In the example of FIG. 1, the acoustic generator 14 consists of an arbitrary waveform generator (AWG) 15 and an amplifier 16 providing a gigahertz acoustic input signal to a splitter 17. The splitter 17 provides a part of the signal to the oscilloscope 20. The rest of the signal is provided via the circulator 18 to the transducer 12. Any parts of the acoustic signal that is reflected by internal features in the sample may be received again via the transducer in circulator 18 which provides this part of the signal to the oscilloscope 20.

Any motion of the probe tip 10 perpendicular to the surface of the sample 5 may be analyzed via topographical analyzer 22. As the tip 10 scans across the surface of sample 5, changes in topography of the sample 5 cause changes in the deflection of the cantilever 9. The deviation of the vertical deflection from the deflection setpoint caused by this cantilever bending change is called the deflection error signal. Element 23 provides this deflection error signal. The subsurface signal is analyzed via lock-in amplifier 25 for which the subsurface amplitude 26 and the subsurface phase 27 may be obtained. The system 1 illustrated in FIG. 1 enables to detect the surface topography of the sample 5 and additionally a subsurface topography. Any overlay and alignment errors may be detected by comparing the surface topography with the subsurface, as will be further explained below.

Figure 2:
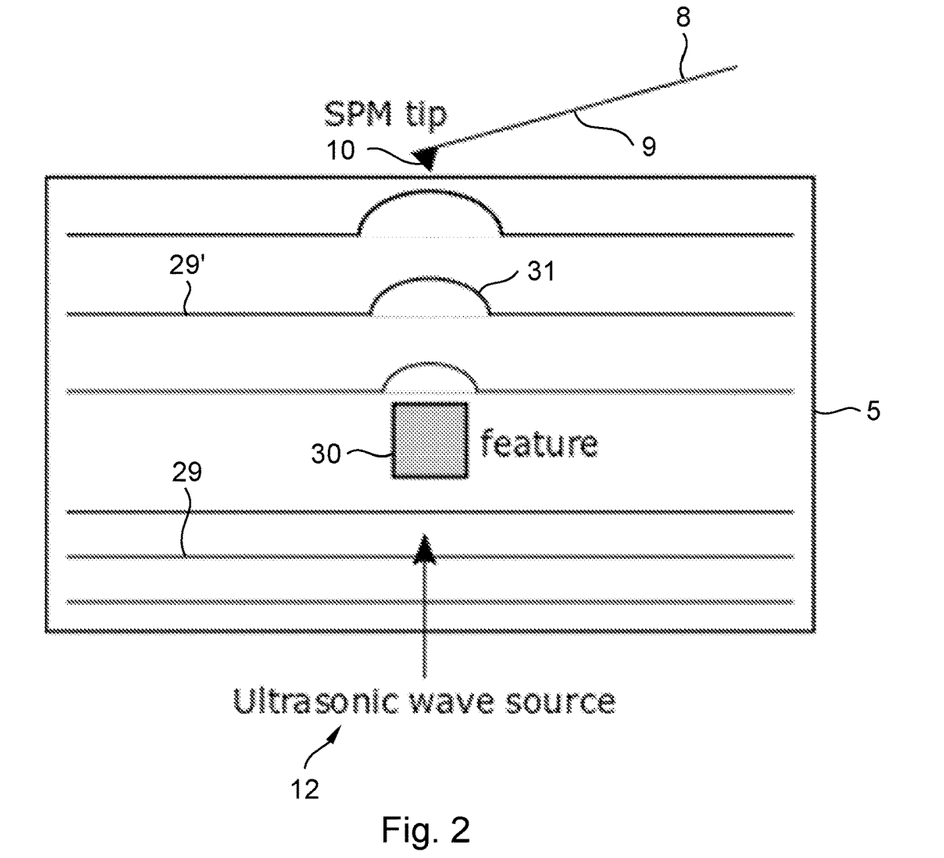
FIG. 2 schematically illustrates how subsurface device features are visualized using a scattering based subsurface scanning probe microscopy method, which may be applied using the system illustrated in FIG. 1.

FIG. 2 schematically illustrates the principle of subsurface topography measurements using an SPM system, for example system 1 as illustrated in FIG. 1. The ultrasonic wave source 12 (the transducer 12 in FIG. 1) provides an acoustic input signal to the sample 5. In case a feature 30 is present internally in the sample 5, the acoustic signal 29 is locally disturbed by the feature 30. Hence, downstream of the feature 30, a disturbance 31 will propagate to the surface of the sample 5. The acoustic signal 29', including any disturbances 31, can be sensed by the probe tip 10 of the probe 8. Subsurface topography measurements may be performed with acoustic input signals in various different frequency ranges. The sensing mechanism is different though, dependent on the frequency of the acoustic signal. For low frequencies, e.g. typically up to 100 MHz, the elastic properties of the material of sample 5 enable the sensing of subsurface features. In fact, at these frequencies, the subsurface features are typically felt due to differences in elastic properties there where a subsurface feature is present. This can be derived from the output signal indicative of the motion of the probe tip 10 transverse to the surface of sample 5. At high frequencies of the acoustic input signal, e.g. above 500 MHz but preferably even above 1 gigahertz (GHz), the elastic properties no longer play a role due to the material of the sample 5 being inert to such frequencies. Instead, the acoustic signal 29 propagates through the sample 5 as illustrated in FIG. 2, and is scattered by obstructions encountered. In fact sensing at these frequencies is performed by measuring the acoustic signal received after it has propagated through the sample 5. The acoustic signal may be applied to any desired part of the sample 5, but in the present example it is applied to the bottom of the sample 5 opposite the sample surface.

The sensitivity of the probe 8 to received vibrations is limited by its characteristics, such as the dimensions and design of the probe and its material. The probes resonance frequencies defining its operational range are typically far below the abovementioned acoustic frequencies (typically below 2 MHz), such that the abovementioned acoustic frequencies are outside this range. To enable sensing, the acoustic input signal 29 may be a heterodyne signal, consisting of two (or more) frequencies with a frequency difference which is within the operational range of the probe 8. The mixing of both frequencies created a signal component at the difference frequency, which can be sensed. Motion of the probe tip 10 is therefore affected by the acoustic signal 29' and the disturbances 31. As a result, by analyzing the motion of the probe tip 10 using locking amplifier 25 in FIG. 1, the subsurface amplitude and subsurface phase of the acoustic signal 29' may be determined, from which the subsurface topography can be derived.

Figure 3:
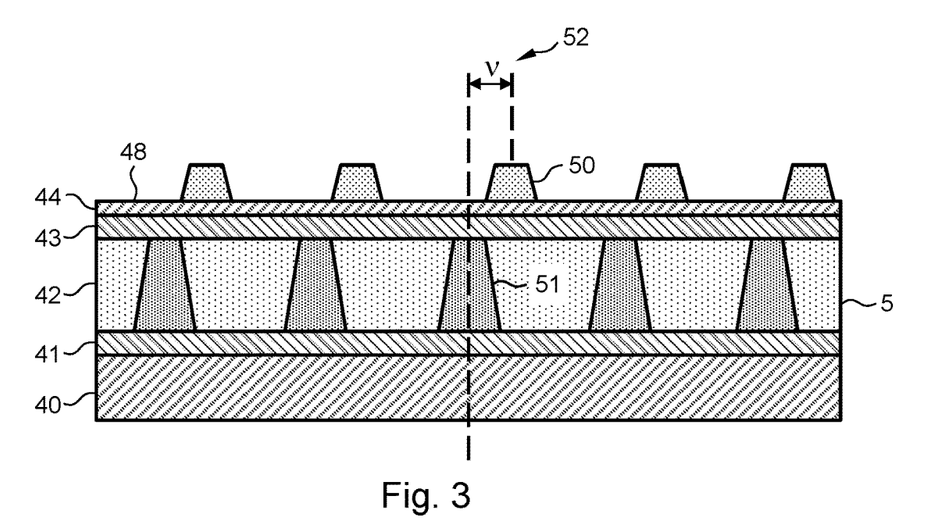
FIG. 3 schematically illustrates an example of an overlay error between two layers of a semi-manufactured semiconductor device.

FIG. 3 schematically illustrates an overlay error. In FIG. 3, a sample 5 consists of a plurality of layers 40-44. Subsurface features of the sample 5 are present in layer 42 internally in the sample. The surface topography at the surface 48 of the sample 5 preferably closely matches the topography of layer 42. In fact, any mismatch between the surface topography of surface 48 and the topography in layer 42 will affect the functioning of the device that is created from the sample 5. Layer 42 comprises a plurality of subsurface features, for example feature 51. The location of feature 50 at the surface of sample 5 should ideally be completely overlapping with the location of feature 51 to provide minimum overlay error. However, as can be seen in FIG. 3, a slight difference in the location of feature 50 results in an overlay error 52 indicated by v. Overlay errors such as 52 may result from inaccuracy in the fabrication process, resulting in slight translations of the surface topography of surface 48 or rotation thereof resulting in alignment errors. If the topography of surface 48 is not well aligned with the topography at layer 42, differences such as overlay error 52 may occur.

Figure 4A:
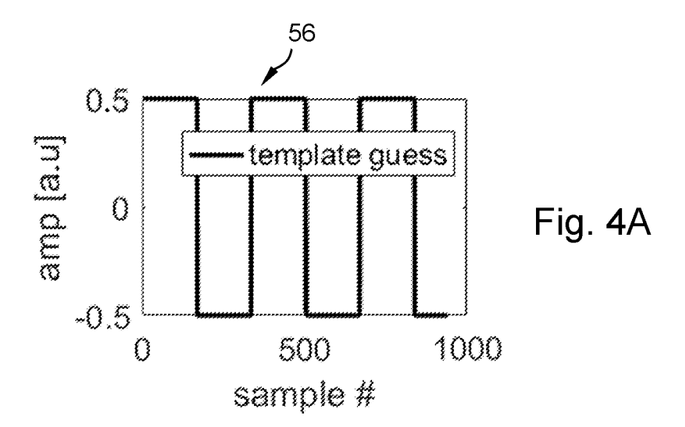
FIGS. 4a to 4c schematically illustrate a generated pattern template, a measured topography, and a graph illustrating the correlation value dependent on a correlation lag number, used in embodiments of the present invention applying a direct model approach.
Figure 4B:
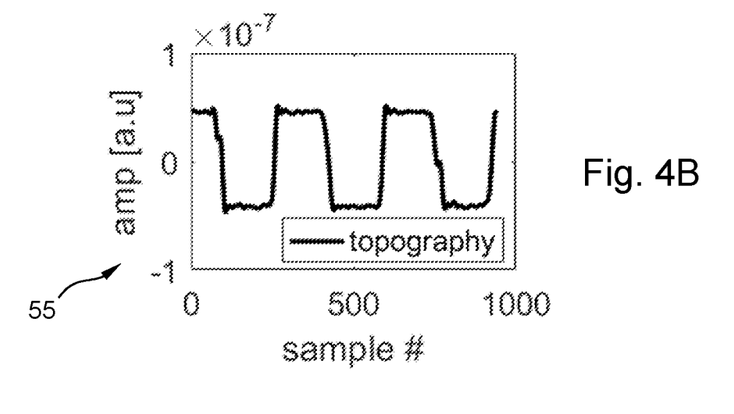
Figure 4C:
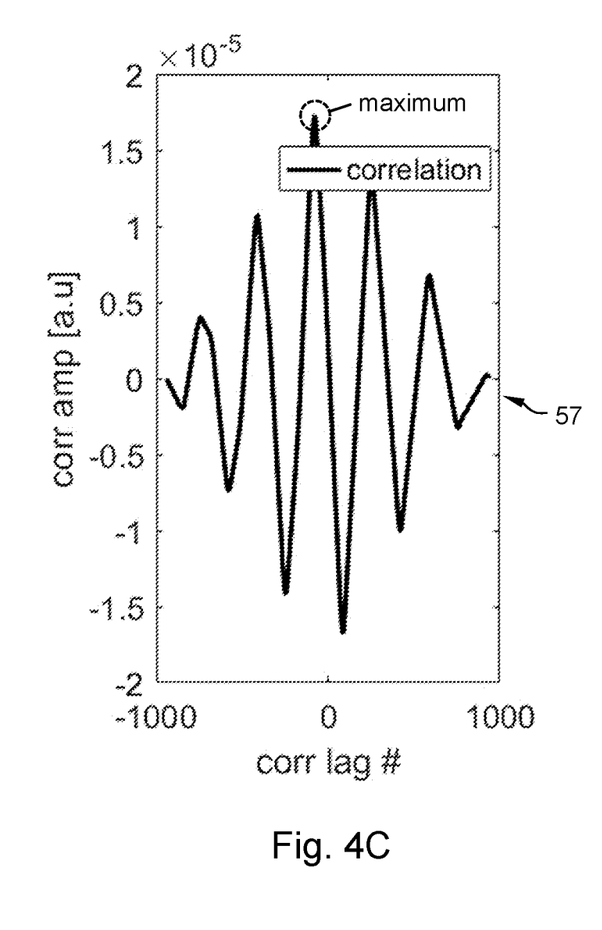

In accordance with the present invention, as illustrated in FIGS. 4A through 4C, the sensed surface topography is first matched with a template, after which a correlation between the template and the subsurface topography may be determined. For example as illustrated in FIG. 4B, the surface topography of sample 5 may yield a signal 55 from the SPM system. In a first embodiment of the present invention, sometimes referred to herein as the direct model, the analyzer of SPM system 1 applies a plurality of different pattern templates available e.g. from a memory, such as the template 56 illustrated in FIG. 4A. In accordance with the direct model, the pattern templates are matched against a measured surface topography 55, and the best correlating pattern template may be used as candidate template for the surface topography. The template may optionally be scaled in width and height, and thereafter serve as the first candidate pattern in the method of the invention, associated with the surface topography. Next, the first candidate pattern is correlated with the sensed subsurface topography, as illustrated in FIG. 4C, in order to determine a second candidate pattern for modelling the sensed subsurface topography. A second candidate pattern may be selected that provides maximum correlation. The method will then use both the first candidate pattern and the second candidate pattern to obtain the overlay characteristics, for example in FIG. 3 these would be the overlay characteristics of the surface vis-à-vis layer 42. Any overlay characteristics, such as the deviation 52 in FIG. 3, may be obtained by comparing the first candidate pattern which models the surface topography with the second candidate pattern which models the subsurface topography.

Figure 5:
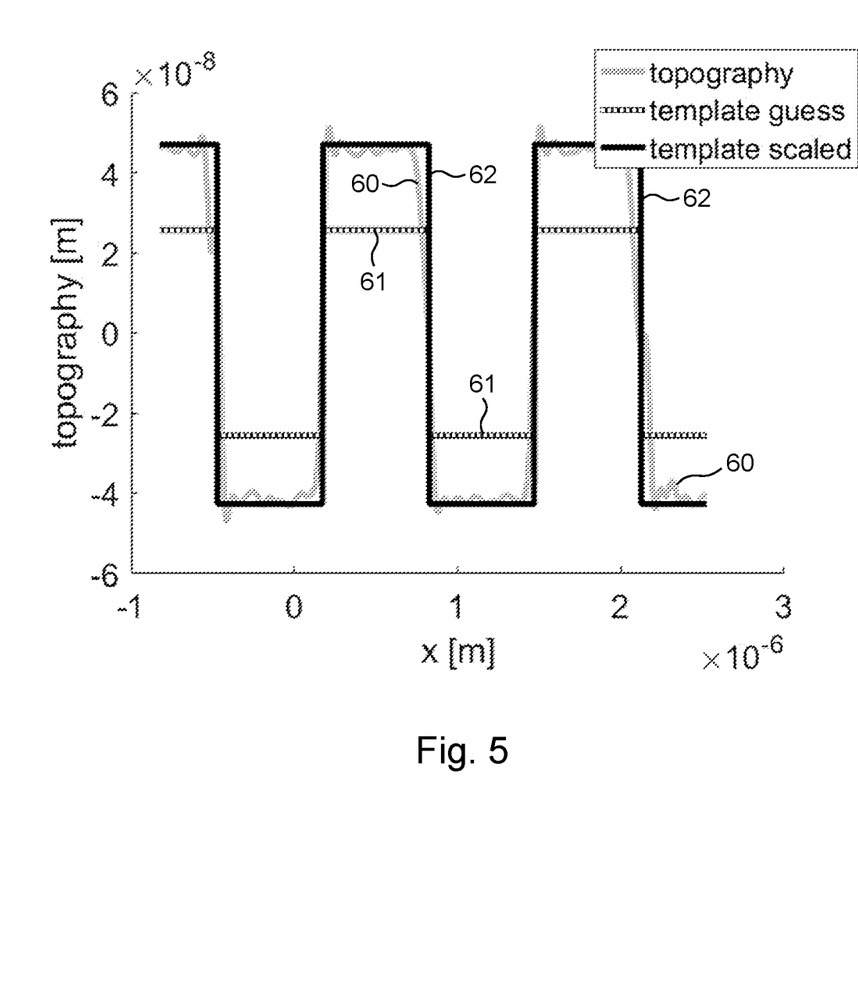
FIG. 5 illustrates an example of a guessed pattern matched with a measured topography, used in embodiments of the present invention applying a guessed model approach.

In a further embodiment of the invention, as illustrated in FIG. 5, a guessed template 61 is created based on the sensed surface topography 60, and the guessed template 61 is correlated with the surface topography. Any deviations between the surface topography and the guessed template, which result in reduced correlation between the template and the real topography, may be corrected by scaling and modifying the guessed template. Eventually, this will yield a best matching first candidate pattern 62 for the surface topography. Similar to what has been described above, this best matching first candidate pattern for the surface topography will then be used for determining a second candidate pattern for the subsurface topography. This is likewise done by correlation.

Figure 6:
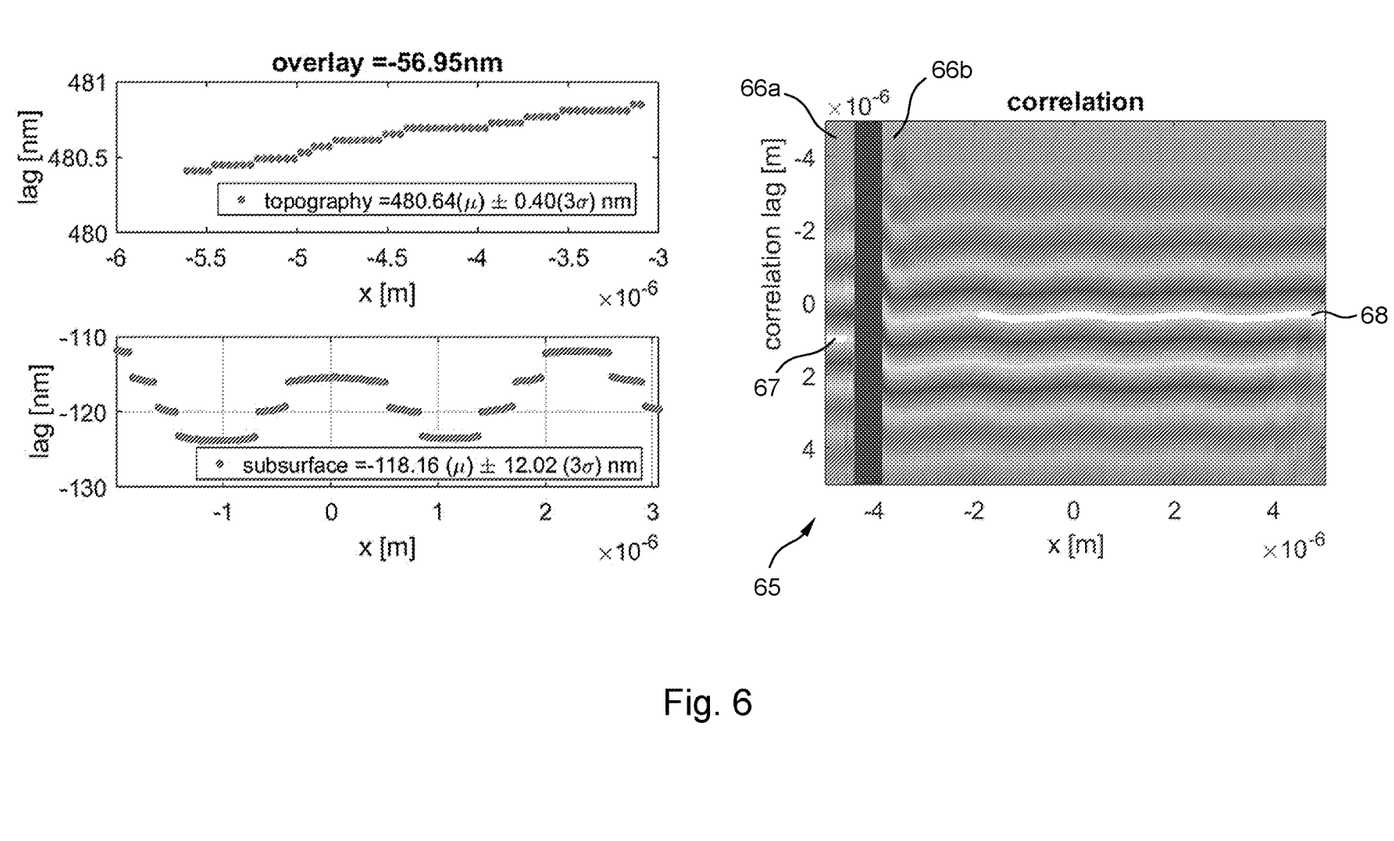
FIG. 6 provides exemplary results of an overlay calculation following a one dimensional line-by-line correlation in accordance with an embodiment of the method of the invention.

FIG. 6 schematically illustrates the results of an overlay and alignment detection process in accordance with the present invention. The results of FIG. 6 have been obtained using a one dimensional (1D) line-by-line correlation in accordance with some embodiments of the present invention. On the right hand side of FIG. 6, there is provided a cross correlation of a 1D template with topography measurement lines (left side 66a of the blue bar) and with a lot of subsurface measurement lines (right side 66b of the blue bar). The correlation is done line-by-line. The vertical axes indicate the lag of the cross correlation with the template. The maximum lag is reported roughly between reference numerals 67 and 68, the white dots in the figure, and is reported also in the left hand graphs of FIG. 6. In the top left graph, the lag of cross correlation for the topography is plotted, additionally including the mean and standard deviation. In the lower left graph, the lag of cross correlation for the subsurface is plotted, additionally including mean and standard deviation. The difference between mean correlation lag of topography and mean correlation lag of subsurface is indicated as overlay.

Figure 7:
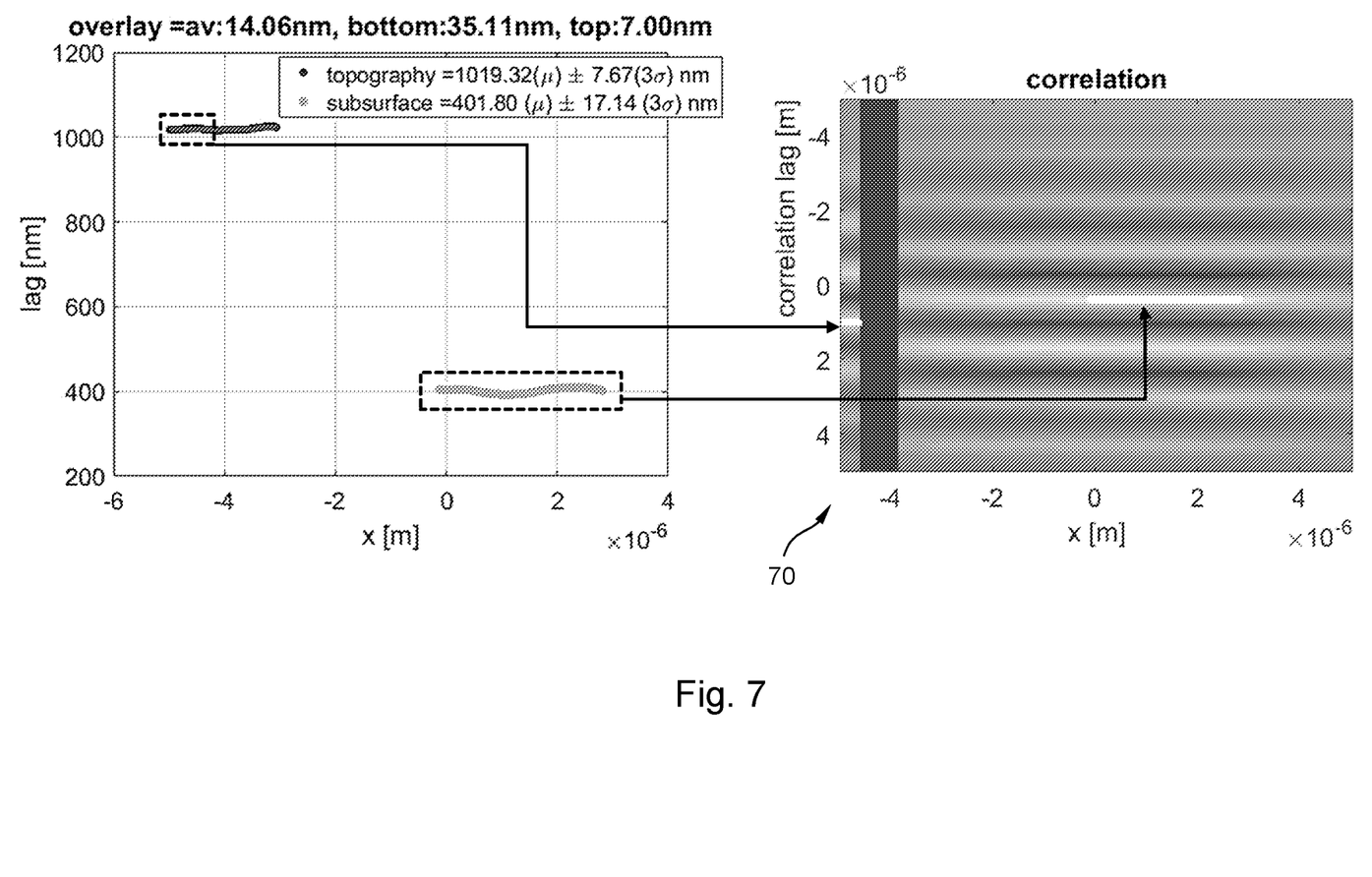
FIG. 7 provides exemplary results of an overlay calculation following a two-dimensional line-by-line correlation in accordance with an embodiment of the method of the invention.

FIG. 7 schematically illustrates the results of two dimensional (2D) correlation approach for determining the alignment and the overlay error in the sample. FIG. 7 is largely similar to FIG. 6, although the template is a 2D pattern with an extension in the x direction to obtain a 2D correlation that is smoother compared to the one illustrated in FIG. 6. The left hand side of FIG. 7 is a merge of the similar two graphs of FIG. 6, although in FIG. 7 these are reported on the same graph which suggests visually the relative lag between surface and subsurface topographies. A very large relative lag difference between the surface and subsurface topography (more than the expected overlay) can occur in case of contrast inversion between topography and subsurface. Then the correlation shows an additional half pitch offset.

Figure 8:
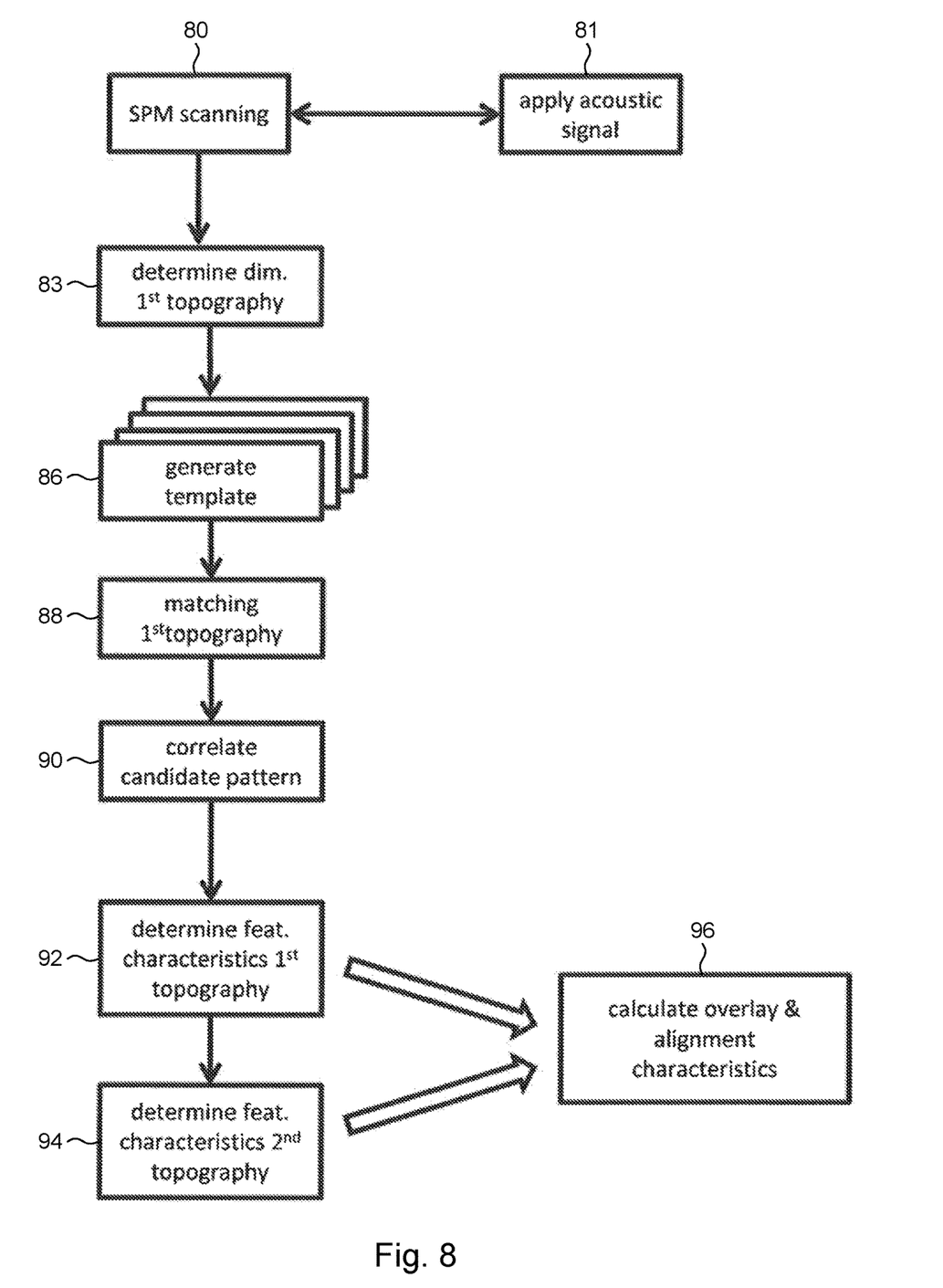
FIG. 8 is an overview of the method following a direct model approach.

FIG. 8 is a schematic overview of a method in accordance with an embodiment of the present invention, relating to a direct model approach. In accordance with the present invention, an SPM system such as system 1 in FIG. 1, in step 80, scans the surface of a sample using a probe 8 with probe tip 10. At the same time, an acoustic signal is applied in step 81 to enable the detection of a subsurface topography. From the scanning step 80 measurements of the surface topography and the subsurface topography may be obtained. In step 83, the dimensions of the first topography may be determined from the measurement. In step 86 a plurality of pattern templates is generated, or may already be available in the analysis system of the SPM. The templates are to be matched with the first topography, which may include scaling the template in terms of its width and height. This yields a first candidate pattern for the surface topography. The matching and scaling is performed in step 88. Next, in step 90, the first candidate pattern for the surface topography is correlated with the measured subsurface topography. This yields a second candidate pattern for the subsurface topography. From the first candidate pattern, in step 92, the feature characteristics of the surface topography may be derived. Similarly, in step 94 the feature characteristics of the subsurface topography may be derived from the second candidate pattern. From these, in step 96, the overlay and alignment characteristics may be calculated. For example, an average overlay value may be determined as follows:

$$\overline{\text{overlay}} = |\mu_{topo\_1} - \mu_{topo\_2}| - 0.5 \cdot <w_{topo\_1} + w_{topo\_2}> \quad \text{(eq. 3)}$$

Herein, $\mu_{topo\_1}$ is indicative of a mean position of a device feature in the first topography determined from the first candidate pattern, and $\mu_{topo\_2}$ is indicative of the mean position of the device feature in the second topography determined from the second candidate pattern. Furthermore, $w_{topo\_1}$ is indicative of a mean width of the device feature in the first topography determined from the first candidate pattern, and $w_{topo\_2}$ is indicative of the mean width of the device feature in the second topography determined from the second candidate pattern.

Figure 9:
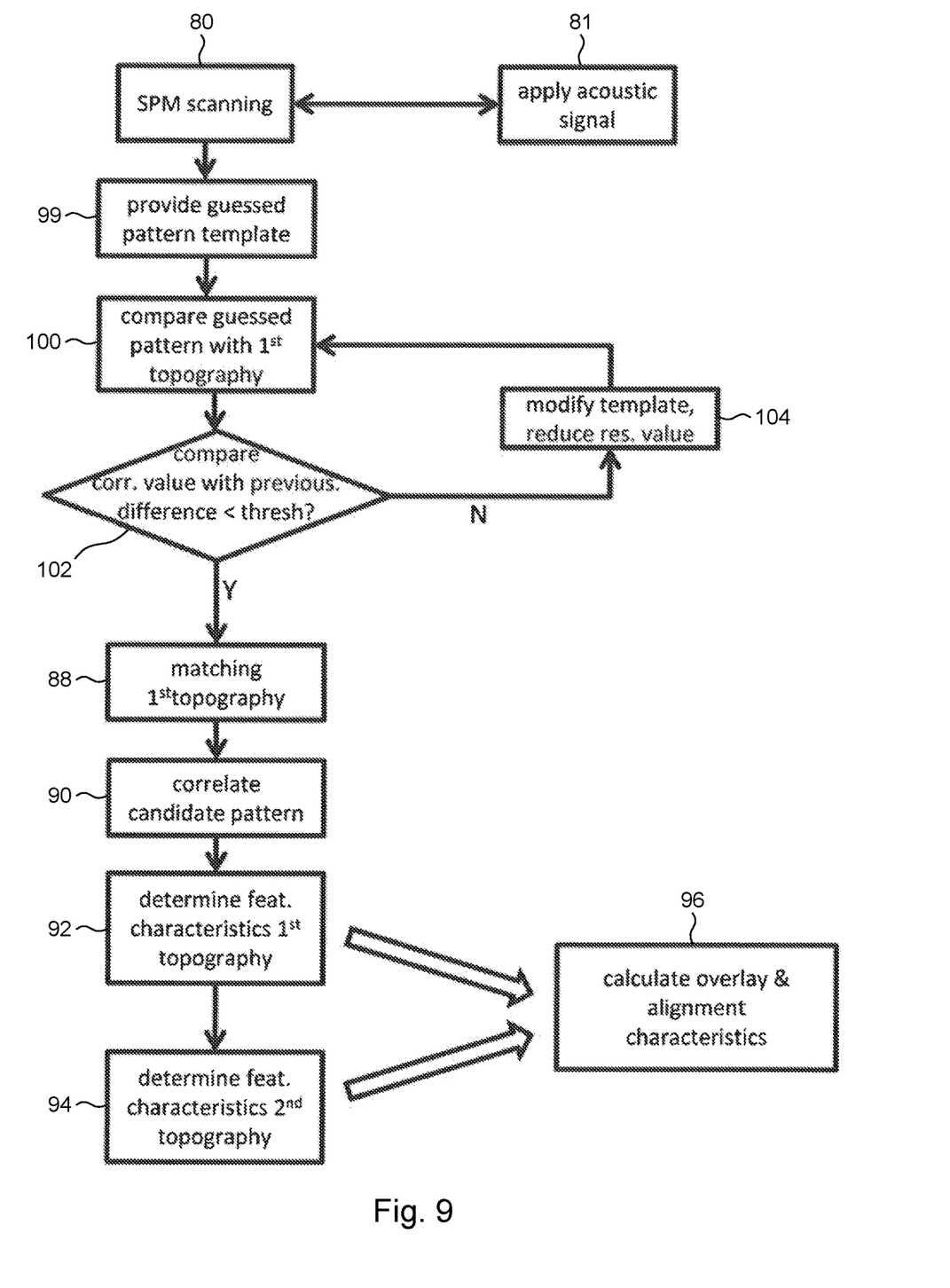
FIG. 9 is an overview of the method following an inverse model approach.

The embodiment of FIG. 9 is similar to the embodiment of FIG. 8, but in the embodiment of FIG. 9 an inverse model approach is used for determining a first candidate pattern for the first topography using an iterative process. In FIG. 9, in step 99 a guessed pattern template is determined based on the topography measurement of the surface topography. This guessed pattern is used as subject pattern in the iterative process and is in step 100 compared with the first topography to obtain a correlation value. During the iterative process, this correlation value determined in step 100 is compared with the correlation value obtained in step 100 of the previous cycle of the iterative process. The comparison is performed in step 102, wherein it is determined whether the current correlation value determined in step 100 differs from the previous correlation value by at least a threshold value. If the difference between the present correlation value and the previous correlation value exceeds the threshold, then the method continues in step 104 wherein the template is modified to reduce the residual value with respect to the surface topography. Modification of the template may be performed by applying a least squares algorithm in order to reduce the residual value. For example, as mentioned hereinbefore, step 104 may be performed by applying a least squares algorithm which minimizes the cost function for the cost value J, wherein:

$$J = \frac{1}{L}\sum_{i=1}^{L}(P_{topography} - P_{template})^2. \quad \text{(eq. 4)}$$

Herein, L represents a length in pixels of the measured first topography; $P_{topography}$ is a feature characteristic of the measured first topography; and $P_{template}$ is the corresponding feature characteristic of the subject pattern. The term $(P_{topography} - P_{template})$ thereby represents the current residual parameter. After completion of step 104, the iterative process continues in a next cycle by again applying step 100, wherein the subject pattern is compared with a first topography and a new current correlation value and residual value are determined. If in step 102 the present correlation value only slightly differs from the previous correlation value, and the difference is less than a threshold, it is assumed that an optimum is reached, and the method continues in step 88. The rest of the method may be applied similarly to the method of FIG. 8, including the determining of e.g. an average overlay value in step 94.

The present invention has been described in terms of some specific embodiments thereof. It will be appreciated that the embodiments shown in the drawings and described herein are intended for illustrated purposes only and are not by any manner or means intended to be restrictive on the invention. It is believed that the operation and construction of the present invention will be apparent from the foregoing description and drawings appended thereto. It will be clear to the skilled person that the invention is not limited to any embodiment herein described and that modifications are possible which should be considered within the scope of the appended claims. Also kinematic inversions are considered inherently disclosed and to be within the scope of the invention. Moreover, any of the components and elements of the various embodiments disclosed may be combined or may be incorporated in other embodiments where considered necessary, desired or preferred, without departing from the scope of the invention as defined in the claims.

In the claims, any reference signs shall not be construed as limiting the claim. The term 'comprising' and 'including' when used in this description or the appended claims should not be construed in an exclusive or exhaustive sense but rather in an inclusive sense. Thus the expression 'comprising' as used herein does not exclude the presence of other elements or steps in addition to those listed in any claim. Furthermore, the words 'a' and 'an' shall not be construed as limited to 'only one', but instead are used to mean 'at least one', and do not exclude a plurality. Features that are not specifically or explicitly described or claimed may be additionally included in the structure of the invention within its scope. Expressions such as: "means for . . . " should be read as: "component configured for . . . " or "member constructed to . . . " and should be construed to include equivalents for the structures disclosed. The use of expressions like: "critical", "preferred", "especially preferred" etc. is not intended to limit the invention. Additions, deletions, and modifications within the purview of the skilled person may generally be made without departing from the spirit and scope of the invention, as is determined by the claims. The invention may be practiced otherwise then as specifically described herein, and is only limited by the appended claims.

The invention claimed is:

1. A method of monitoring at least one of an overlay or an alignment between a first and a underlying second layer of a semiconductor substrate using a scanning probe microscopy system, wherein the method comprises:
   scanning the substrate surface, using a probe tip of the scanning probe microscopy system, in at least one scanning direction, for obtaining a measurement of a first topography of the first layer and of a second topography of the underlying second layer in the at least one scanning direction said probe tip receiving an acoustic signal provided from a transducer and having propagated through the substrate;
   generating at least one pattern template and matching the measured first topography with the at least one pattern template for determining a first candidate pattern to represent the measured first topography in the at least one scanning direction;

correlating the first candidate pattern with the measured second topography for obtaining a second candidate pattern to represent the measured second topography in the at least one scanning direction;

determining, from the first candidate pattern, one or more feature characteristics of device features in the first topography;

determining, from the second candidate pattern, one or more feature characteristics of device features in the second topography; and calculating, using the determined feature characteristics of the first and second topography, one or more overlay parameters or alignment parameters.

2. The method according to claim 1, wherein the first layer is the surface layer of the semiconductor substrate, such that the first topography is a surface topography of the semiconductor substrate.

3. The method according to claim 1, wherein the step of generating at least one pattern template includes generating a plurality of pattern templates, and wherein the step of matching the measured first topography comprises correlating the measured first topography with each one of the plurality of pattern templates and selecting, as the first candidate pattern, a best matching pattern template of the plurality of pattern templates which best correlates with the measured first topography.

4. The method according to claim 3, wherein prior to the step of generating, the method comprises obtaining one or more topography dimensions of the first topography.

5. The method according to claim 1, wherein the step of generating at least one pattern template includes, based on the measured first topography, providing an initially guessed pattern template and using the initially guessed pattern template as a subject pattern at an input of an iterative process for generating the first candidate pattern.

6. The method according to claim 5, wherein the iterative process includes:

comparing the subject pattern with the measured first topography for determining a current correlation value and a current residual parameter, the current residual parameter being indicative of difference between a feature characteristic of the measured first topography and the subject pattern;

determining whether a difference between the current correlation value and a preceding correlation value determined in a preceding iteration is smaller or larger than a predetermined threshold; and if the difference is larger than the predetermined threshold, setting the current correlation value to become the preceding correlation value and modifying the subject pattern based on the residual parameter such as to decrease the value of the residual parameter; or if the difference is smaller than the predetermined threshold, setting the subject pattern to become the first candidate pattern and ending the iterative process.

7. The method according to claim 5, wherein the iterative process includes a least squares algorithm for minimizing a current residual parameter.

8. The method according to claim 7, wherein the least squares algorithm includes minimization of a cost function, wherein the cost function is:

$$J = \frac{1}{L}\sum_{i=1}^{L}(P_{topography} - P_{template})^2$$

wherein
J represents the cost value;
L represents a length in pixels of the measured first topography;
$P_{topography}$ is a feature characteristic of the measured first topography; and
$P_{template}$ is the feature characteristic of the subject pattern; such that the term $(P_{topography}-P_{template})$ represents the current residual parameter.

9. The method according to claim 5, wherein the first layer is the surface layer of the semiconductor substrate, such that the first topography is a surface topography of the semiconductor substrate, and wherein prior to performing the iterative process, the initially guessed pattern template is scaled such that an amplitude of the initially guessed pattern template matches the amplitude of the measured first topography.

10. The method according to claim 9, wherein the amplitude is indicative of a pixel value difference between a pixel located on an elevated part of the substrate surface and a pixel located on a lowered part of the substrate surface.

11. The method according to claim 1, wherein the step of calculating one or more overlay parameters or alignment parameters includes calculating an average overlay value between the first and the second underlying layer of the semiconductor substrate as follows:

$$\overline{overlay}=|\mu_{topo\_1}-\mu_{topo\_2}|-0.5\cdot<w_{topo\_1}+w_{topo\_2}>$$

wherein
$\mu_{topo\_1}$ is indicative of a mean position of a device feature in the first topography determined from the first candidate pattern;
$\mu_{topo\_2}$ is indicative of the mean position of the device feature in the second topography determined from the second candidate pattern;
$w_{topo\_1}$ is indicative of a mean width of the device feature in the first topography determined from the first candidate pattern; and
$w_{topo\_2}$ is indicative of the mean width of the device feature in the second topography determined from the second candidate pattern.

12. A scanning probe microscopy system configured for imaging structures on or below a surface of a semiconductor substrate, for enabling the imaging of layer topographies of a first and a second underlying layer of the semiconductor substrate, wherein the system comprises a probe for scanning the semiconductor substrate for performing said imaging, the system further including one or more system controller and analyzer parts comprising a processor configured to perform the method according to claim 1.

13. A computer program product for operating a scanning probe microscopy system, the computer program product comprising instructions which, when the program is executed by a computer, cause the computer to carry out the method according to claim 1.

14. A non-transitory computer-readable medium comprising instructions for causing a processor to carry out the method according to claim 1.

15. The method of claim 2, wherein the one or more topography dimensions of the first topography include a width or a length of a device feature at a top or bottom of the device feature, an angle between faces or edges of one or more device features, a pitch of a repetitive pattern, or the height of the features.

16. The method of claim 13, wherein the computer communicates with a controller or analyzer of the scanning probe microscopy system.

17. The method of claim 14, wherein the processor is included in a controller or analyzer of the scanning probe microscopy system.

\* \* \* \* \*